(12) United States Patent
Cho

(10) Patent No.: US 11,631,757 B2
(45) Date of Patent: Apr. 18, 2023

(54) GRAPHENE SPIN TRANSISTOR AND GRAPHENE RASHBA SPIN LOGIC GATE FOR ALL-ELECTRICAL OPERATION AT ROOM TEMPERATURE

(71) Applicant: Korea Advanced Institute of Science and Technology, Daejeon (KR)

(72) Inventor: Sungjae Cho, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/941,122

(22) Filed: Jul. 28, 2020

(65) Prior Publication Data

US 2021/0036133 A1 Feb. 4, 2021

(30) Foreign Application Priority Data

Jul. 30, 2019 (KR) .................. 10-2019-0092388

(51) Int. Cl.
*H01L 29/66* (2006.01)
*H01L 29/16* (2006.01)
*H01L 29/423* (2006.01)

(52) U.S. Cl.
CPC .... *H01L 29/66984* (2013.01); *H01L 29/1606* (2013.01); *H01L 29/4232* (2013.01)

(58) Field of Classification Search
CPC . H01L 29/66984; H01L 29/78; H01L 29/786; H01L 29/1606; H01L 29/16; H01L 29/161; H01L 29/18; H01L 29/4232; H01L 29/78648; H01L 29/66045; H01L 29/0684; H01L 43/00; H01L 43/04; H01L 43/06; H01L 43/10; H01L 43/14; H01L 43/065;

(Continued)

(56) References Cited

U.S. PATENT DOCUMENTS 8,125,247 B2 * 2/2012 Koo ................ H03K 19/091
326/100
10,217,798 B2 * 2/2019 Hu .................. H01L 27/224

(Continued)

FOREIGN PATENT DOCUMENTS

KR 1020190005080 A 1/2019
KR 1020190012050 A 2/2019

OTHER PUBLICATIONS

Kato et al., Coherent spin manipulation without magnetic fields in strained semiconductor (2004), Nature, Lett., vol. 427, pp. 50-52; doi:10.1038/nature02202. (Year: 2004).*

(Continued)

*Primary Examiner* — Natalia A Gondarenko
(74) *Attorney, Agent, or Firm* — The Webb Law Firm

(57) ABSTRACT

The present disclosure relates to a graphene spin transistor for all-electrical operation at room temperature and a logic gate using the graphene Rashba spin transistor. A graphene spin transistor of the present disclosure provides a graphene spin FET (Field Effect Transistor) for all-electrical operation at room temperature without a magnetic field or a ferromagnetic electrode by utilizing the Rashba-Edelstein effect in the graphene or the spin Hall effect of a TMDC (Transition Metal Dichalcogenide) material in order to replace CMOS transistors and extend Moore's Law, and further provides a logic gate using the graphene Rashba spin transistor.

10 Claims, 18 Drawing Sheets

(58) Field of Classification Search
CPC ..... H01L 21/28568; H01L 2924/01103; H01L 29/66969; H01L 29/24; H01L 29/518; H01L 29/267; H01L 29/155; H01L 29/78684; H01L 29/78642; H01L 27/092; H01L 27/7827; H01L 29/122; H01L 29/66015; H01L 29/66469; H01L 29/66439; H01L 29/66977; H01L 29/03; H01L 29/7782; H01L 29/0673; H01L 29/0665; H01L 29/8696; H01L 29/66742; H01L 29/1054; H01L 29/778; H01L 29/423; H01L 29/42372; H01L 29/66409; H01L 29/7391; H01L 29/66356; H01L 29/7606
USPC ................... 257/288, 27, 29, 29.04, 29.068
See application file for complete search history.

(56) References Cited

U.S. PATENT DOCUMENTS

| | | | |
|---|---|---|---|
| 10,608,095 B2 | 3/2020 | Lee et al. | |
| 2014/0170779 A1* | 6/2014 | Keiber | H01L 29/4908 438/3 |
| 2015/0333123 A1* | 11/2015 | Koo | H01L 43/08 257/24 |
| 2017/0098760 A1* | 4/2017 | Lin | H01L 29/22 |
| 2017/0229576 A1* | 8/2017 | Cho | H01L 29/78681 |

OTHER PUBLICATIONS

Safeer et al., "Room-Temperature Spin Hall Effect in Graphene/MoS2 van der Waals Heterostructures", Jan. 4, 2019, Nano Lett., 19, pp. 1074-1082. (Year: 2019).*
Bandyopadhyay et al., "A spin field effect transistor for low leakage current", Physica E, 2005, vol. 25, pp. 399-403.
Brar et al., "Emerging photonic architectures in two-dimensional opto-electronics", Chem. Soc. Rev., 2018, vol. 47, pp. 6824-6844.
Choi et al., "Ferromagnet-Free All-Electric Spin Hall Transistors", Nano Letters, 2018, vol. 18, pp. 7998-8002.
Chuang et al., "All-electric all-semiconductor spin field-effect transistors", Nature Nanotechnology, 2014, vol. 10, pp. 35-39.
Dankert et al., "Electrical gate control of spin current in van der Waals heterostructures at room temperature", Nature Communications, 2017, vol. 8, 6 pages.
Garcia et al., "Spin transport in graphene/transition metal dichalcogenide heterostructures", Chem. Soc. Rev., 2018, vol. 47, pp. 3359-3379.
Li et al., "High-performance sub-10-nm monolayer black phosphorene tunneling transistors", Nano Reseach, 2018, vol. 11(5), pp. 2658-2668.
Pop, "Energy Dissipation and Transport in Nanoscale Devices", Nano Research, 2010, vol. 3, pp. 147-169.
Shim et al., "Recent progress in Van der Waals (vdW) heterojunction-based electronic and optoelectronic devices", Carbon, 2018, vol. 133, pp. 78-89.

* cited by examiner

GRAPHENE SPIN TRANSISTOR AND GRAPHENE RASHBA SPIN LOGIC GATE FOR ALL-ELECTRICAL OPERATION AT ROOM TEMPERATURE

CROSS-REFERENCE TO RELATED APPLICATION

This application claims priority to Korean Patent Application No. 10-2019-0092388 filed Jul. 30, 2019, the disclosure of which is hereby incorporated by reference in its entirety.

BACKGROUND OF THE INVENTION

1. Field of the Invention

The present disclosure relates to a graphene spin transistor for all-electrical operation at room temperature without a magnetic field and a ferromagnetic material, and further relates to a logic gate using the same.

2. Description of the Prior Art

The advancement of information processing and communication technologies through integration and miniaturization of CMOS (Complementary Metal-Oxide-Semiconductor) transistors, which have progressed for the past 50 years according to Moore's Law, has drastically changed today's lives and society in all fields. A recent foreign study (Pop, E. 2010, Nano Res. 3, 147) reported that standby power consumption in an off state, which was previously negligible, has become similar to the level of switching power consumption in an on state due to integration of transistors. The energy consumption of a current CMOS integrated circuit reaches 10 kW/cm$^2$, which is the maximum energy consumption that can be handled by current heat sink technology. Therefore, it is no longer possible to integrate and miniaturize transistors according to Moore's Law because of the limitation on power consumption.

As an alternative to this, a spin FET (Field Effect Transistors) has been proposed as a transistor that goes beyond CMOS technology. A Das-Datta spin FET, which is a representative of spin FETs proposed to date, is known to inevitably have a large leakage current and large standby power consumption because a ferromagnetic electrode used therein causes spin-flipping due to the presence of a magnetic field in the channel, thereby exhibiting lower energy efficiency than the existing CMOS technology (see Physica E 25, 399).

Therefore, the development of a spin FET for all-electrical operation without using a ferromagnetic material and without an external magnetic field is considered important as a next-generation technology (beyond CMOSs) with low power consumption. So far, the development of a spin FET for all-electrical operation has been reported twice; that is, a method of using quantum point contact (see Nature Nanotech, 10, 35) and a method of combining the spin Hall effect in InAs with the gate-driven Rashba spin precession (see Nano Letters 19, 7998) have been reported, but neither can be put to practical use because they are capable of operating only at cryogenic temperatures below the temperature of liquid helium.

Furthermore, if a logic gate were implemented using the spin FET, it would bring about the possibility of overcoming limitations such as integration of the logic gate and standby power thereof based on the existing CMOS technology, but a logic gate using the spin FET has not yet been implemented.

Accordingly, it is very important and urgent to implement a low-power spin transistor for all-electrical operation at room temperature without using a magnetic material and a logic gate with high integration and low power, which is superior to the conventional CMOS, using the spin transistor.

SUMMARY OF THE INVENTION

Therefore, the present disclosure has been made in order to solve the above-mentioned problems, and an objective of the present disclosure is to provide a graphene spin FET (Field Effect Transistor) for all-electrical operation at room temperature without a magnetic field or a ferromagnetic electrode by utilizing the Rashba-Edelstein effect in graphene or the spin Hall effect of a TMDC (Transition Metal Dichalcogenide) material in order to replace the conventional CMOS transistor and extend Moore's Law, and to further provide a logic gate using the same.

First, in summary of the features of the present disclosure, a graphene spin transistor according to an aspect of the present disclosure in order to attain the objective may include: a gate electrode; a gate insulating film configured to insulate the gate electrode; a graphene layer formed to face the gate electrode based on the gate insulating film; and a first TMDC pattern and a second TMDC pattern formed to cross the graphene layer in the transverse direction thereof so as to be spaced a predetermined distance apart from each other in the longitudinal direction thereof, wherein a spin current is generated, controlled, and detected due to spin-biased electrons between the first TMDC pattern and the second TMDC pattern 1) using a spin-momentum locking band structure formed at each interface between the graphene layer and the first TMDC pattern, and between the graphene layer and the second TMDC pattern or 2) using direct and inverse spin Hall effects generated in the first TMDC pattern and the second TMDC pattern, thereby performing operation.

In other words, the graphene spin transistor may operate in an operation mode using the Rashba-Edelstein effect or in an operation mode using the spin Hall effect, and a corresponding mode may be detected from the two operation modes by the types of materials of the first and second TMDC patterns.

Here, the graphene spin transistor based on the Rashba-Edelstein effect may generate excessive spin electrons at the junction surface between the graphene layer and the first TMDC pattern according to the Rashba-Edelstein effect using the current applied to the first TMDC pattern and the voltage applied to the gate electrode, and may control the spin direction of the electrons generated between the graphene layer and the first TMDC pattern, thereby performing operation.

At this time, the graphene spin transistor may operate such that a voltage difference between a first area of the second TMDC pattern and a second area of the graphene layer, which is adjacent to the second TMDC pattern in the opposite direction of the first TMDC pattern, has the characteristics of an off state if the voltage applied to the gate electrode is zero, and has the characteristics of an on state if the applied voltage is greater than or less than a voltage for the off state by a predetermined value.

In addition, the graphene spin transistor may control on/off operation by adjusting the position of the Fermi level of the band structure depending on the voltage applied to the gate electrode.

In addition, the graphene spin transistor may be operated using only electricity without a magnetic field at room temperature.

In addition, the gate insulating film may include an hBN, $SiO_2$, or high-k insulating film. Here, the gate insulating film may be deposited using a method such as chemical vapor deposition (CVD), epitaxy, ALD (atomic layer deposition), or the like.

In addition, the thickness of the gate insulating film may be 1 to 10 nm (preferably, 2 nm to 3 nm).

As a second operation mode, the graphene spin transistor may determine the magnitude of a spin current generated in the first TMDC pattern by the spin Hall effect by the current applied to the first TMDC pattern and the voltage applied to the gate electrode, and may adjust the amount of spin current absorbed from the graphene layer into the second TMDC pattern, thereby performing operation.

In addition, the graphene spin transistor may operate such that the voltage difference between a first area of the second TMDC pattern and a second area of the graphene layer, which is adjacent to the second TMDC pattern in the opposite direction of the first TMDC pattern, has the characteristics of an on state if the voltage applied to the gate electrode has a value enabling the Fermi level of the band structure to be positioned at a Dirac point (DP), and has the characteristics of an off state if the applied voltage is greater than or less than a voltage for the on state by a predetermined value.

The graphene spin transistor may generate a first voltage difference between a first area of the second TMDC pattern and a second area of the graphene layer, which is adjacent to the second TMDC pattern in the opposite direction of the first TMDC pattern, and, at the same time, may generate a second voltage difference between a third area of the second TMDC pattern and a fourth area of the graphene layer.

The graphene spin transistor may perform a complementary operation in which the first voltage difference and the second voltage difference have opposite signs.

In addition, a method of manufacturing a graphene spin transistor according to another aspect of the present disclosure may include the steps of: forming a gate electrode; forming a graphene layer; and forming a first TMDC pattern and a second TMDC pattern, which intersect the graphene layer, to be spaced a predetermined distance apart from each other, and the graphene spin transistor may induce a spin current due to spin-biased electrons between the first TMDC pattern and the second TMDC pattern using a spin-momentum locking band structure formed at each interface between the graphene layer and the first TMDC pattern, and between the graphene layer and the second TMDC pattern or using the spin Hall effect generated in each of the first TMDC pattern and the second TMDC pattern, thereby performing operation.

In addition, a logic gate using a graphene Rashba spin transistor according to another aspect of the present disclosure may include: a gate electrode; a gate insulating film configured to insulate the gate electrode; a graphene layer formed to face the gate electrode based on the gate insulating film; and a first TMDC pattern and a second TMDC pattern formed to cross the graphene layer in the transverse direction thereof so as to be spaced a predetermined distance apart from each other in the longitudinal direction thereof, wherein a spin current may be induced due to spin-biased electrons between the first TMDC pattern and the second TMDC pattern using a spin-momentum locking band structure formed at each interface between the graphene layer and the first TMDC pattern, and between the graphene layer and the second TMDC pattern, wherein excessive spin electrons may be generated at the junction surface between the graphene layer and the first TMDC pattern according to the Rashba-Edelstein effect by a current applied to the first TMDC pattern and the voltage applied to the gate electrode, and wherein the spin direction of the electrons generated between the graphene layer and the first TMDC pattern may be controlled, thereby performing operation.

Here, the gate electrode may include a first gate electrode formed in an area where the first TMDC pattern intersects the graphene layer and a second gate electrode formed in an area where the second TMDC pattern intersects the graphene layer.

In addition, the voltages applied to the first gate electrode and the second gate electrode may be individually controlled to independently turn on/off two channels.

In addition, the graphene layer may have a structure in which one side thereof is divided into two or more branches.

In this case, two or more gate electrodes may be formed in two or more areas where two or more branches of the graphene layer intersect the first TMDC pattern.

The graphene spin transistor according to the present disclosure may be operated using only electricity at room temperature without a magnetic field and a ferromagnetic material by providing a Rashba spin FET using the Rashba-Edelstein effect in graphene and providing a spin Hall FET and a graphene Rashba spin logic element using the spin Hall effect of a TMDC (Transition Metal Dichalcogenide) material, thereby consuming less power, replacing existing CMOS transistors and logic elements, and extending Moore's Law.

In addition, the present disclosure provides a spin FET for all-electrical operation at room temperature for the first time, which is technology that capable of being commercialized, unlike the low-temperature spin FETs capable of operating only at low temperature at a liquid helium level, which have been previously developed twice. In addition, it is expected that power consumption may be reduced by at least 100 times or more, compared to the conventional CMOS technology.

The semiconductor industry is roughly divided into memory semiconductors for storing information and non-memory semiconductors having operation and control functions. According to data reported by the World Semiconductor Market Statistics Organization, the global non-memory semiconductor market is three times larger than the memory semiconductor market. In particular, recently, the memory semiconductor market has shrunk due to a drop in prices and the like, whereas the introduction of unmanned cars, the Internet of Things, and the like has promoted gradual expansion of the market for non-memory semiconductors capable of processing large amounts of data using low power at high speed. The present disclosure provides next-generation ultra-low power room-temperature spin FETs capable of replacing CMOSs, and logic elements using the same, thereby laying the foundation for the development of technology that leads the non-memory semiconductor market.

BRIEF DESCRIPTION OF THE DRAWINGS

The accompanying drawings included as part of the detailed description in order to help in understanding the present disclosure will provide embodiments of the present disclosure and describe the technical concept of the present disclosure in conjunction with the detailed description.

DETAILED DESCRIPTION OF THE EXEMPLARY EMBODIMENTS

Hereinafter, the present disclosure will be described in detail with reference to the accompanying drawings. In the accompanying drawings, the same or like elements will be designated by the same or like reference signs as much as possible. Further, a detailed description of known functions and/or configurations will be omitted. The following description of the present disclosure is mainly directed to the parts required to understand operations according to various embodiments, and a description of elements that may make the subject matter of the present disclosure unclear will be omitted. In the accompanying drawings, some elements may be exaggerated, omitted, or schematically illustrated. Further, the size of each element does not completely reflect the actual size, and thus the present disclosure is not limited by the relative sizes and distances of elements illustrated in the respective drawings.

In the following description of the present disclosure, a detailed description of known functions or configurations incorporated herein will be omitted when it may make the subject matter of the present disclosure rather unclear. The terms which will be described below are terms defined in consideration of the functions in the present disclosure, and may be different according to users, intentions of the users, or customs. Therefore, the definitions of the terms should be made based on the contents throughout the specification. The terms used in the detailed description are only used to describe embodiments of the present disclosure, and are not intended to limit the present disclosure. A singular expression may include a plural expression unless they are definitely different in a context. As used herein, such expression as "include" or "have" is used to refer to certain features, numerals, steps, operations, elements, a part or combination thereof, and should not be construed to exclude the existence or possibility of one or more other features, numerals, steps, operations, elements, a part or combination thereof.

Further, such terms as "a first" and "a second" may be used to describe various elements, but the corresponding elements are not limited by these terms. These expressions are used only for the purpose of distinguishing between one element and any other element.

Figure 1:
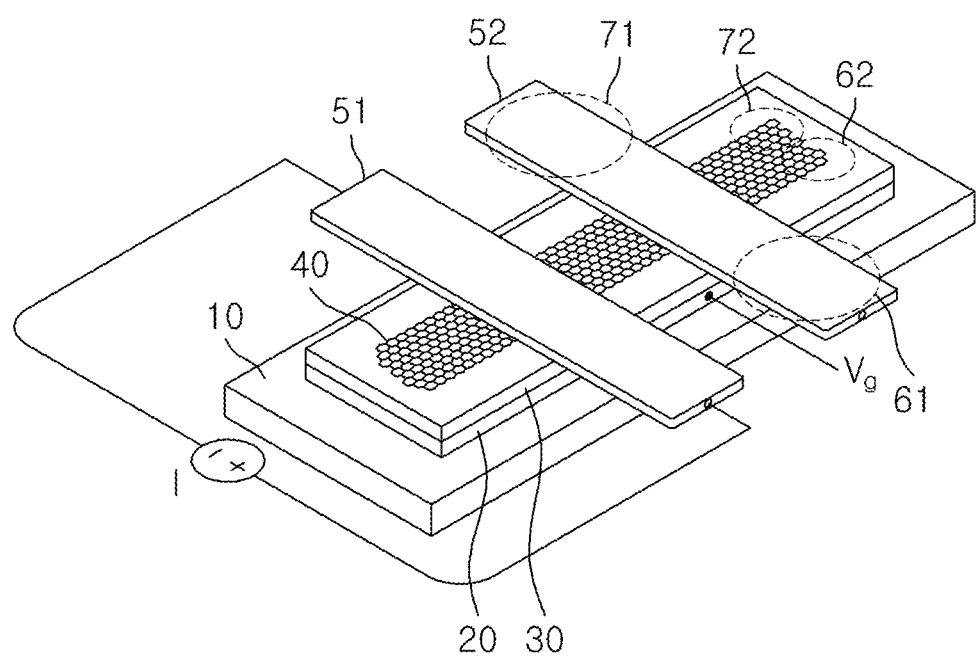
FIG. 1 is a view for explaining the structure of a graphene spin transistor according to an embodiment of the present disclosure.

FIG. 1 is a view for explaining the structure of a graphene spin transistor 100 according to an embodiment of the present disclosure. Hereinafter, a method of manufacturing the graphene spin transistor 100 will be further described in order to explain the structure thereof.

Referring to FIG. 1, a graphene spin transistor 100 according to an embodiment of the present disclosure may include a substrate 10, a gate electrode 20, a gate insulating film 30, a graphene layer 40, a first TMDC pattern 51, and a second TMDC pattern 52. In this case, the first TMDC pattern 51 and the second TMDC pattern 52 may be formed of a TMDC (Transition Metal Dichalcogenide) material such as $TaS_2$, $NbTe_2$, $TiSe_2$, $WS_2$, $WTe_2$, $MoS_2$, or the like, which is a two-dimensional material.

In this case, the first TMDC pattern 51 and the second TMDC pattern 52 may be patterned by depositing the above TMDC material to be formed and simultaneously etching the same, and a predetermined insulating film or a protective layer may be formed thereon, and then both ends of the first TMDC pattern 51 and the second TMDC pattern 52 (the ends in the transverse direction in the drawing) or some necessary portions thereof may be selectively etched to form holes/grooves for contact with metal electrodes. Thereafter, the deposition of a metal layer formed of Al, Cu, Au, Ag, or the like for contact with both selected ends of the first TMDC pattern 51 and the second TMDC pattern 52, and patterning thereof may be performed.

Although only one graphene spin transistor 100 for all-electrical operation at room temperature without a magnetic field is illustrated as an embodiment of the present disclosure in FIG. 1, the present disclosure is not limited thereto, and the graphene spin transistor 100 according to the present disclosure is capable of complementary operation through direct and inverse operations as described below, and is expected to replace CMOS circuits in the non-memory semiconductor field or next-generation ultra-low power electric and electronic fields through integration of circuits including a plurality of graphene spin transistors 100 in series or parallel.

In FIG. 1, various substrates such as a Si substrate, an SOI substrate, a sapphire substrate, a group 3-5 semiconductor compound substrate, or the like may be used as the substrate 10, and an insulating film such as $SiO_2$ or the like may be formed as a buffer layer.

In addition, as shown in FIG. 1, the gate electrode 20 may be formed in a pattern made of metal, such as Al, Cu, Au, Ag, graphite, or the like, on the substrate 10 or an insulating film (e.g., $SiO_2$) thereon, but the present disclosure is not limited thereto. A gate (electrode) voltage Vg is applied to the gate electrode 20.

The gate insulating film 30 may be formed of an hBN, $SiO_2$, high-k insulating film, or the like so as to insulate the gate electrode 20, and is preferably formed of a high-k insulating film or the like in order to improve the electrical properties of the graphene. The high-k insulating film is an insulating film such as $HfO_2$, HfSiO, HfSiON, ZrO, or the like, which has a higher dielectric constant than $SiO_2$. The gate insulating film 30 may be formed to have a thickness of 1 to 10 nm (preferably, 2 nm to 3 nm). The gate insulating film may be deposited using a method such as CVD (Chemical Vapor Deposition), epitaxy, ALD (atomic layer deposition), or the like.

The graphene layer 40 may be formed on the gate insulating film 30. For example, as shown in FIG. 1, the area of the graphene layer viewed from above may be smaller than the area of the gate electrode 20 viewed from above. However, the present disclosure is not limited thereto, and the area of the gate electrode 20 may be smaller depending on the design purpose, and various modifications are possible.

In addition, the first TMDC pattern 51 and the second TMDC pattern 52 may be formed to cross the graphene layer 40 in the transverse direction thereof so as to be spaced a predetermined distance apart from each other in the longitudinal direction thereof.

In this case, the TMDC material such as $TaS_2$, $NbTe_2$, $TiSe_2$, $WS_2$, $WTe_2$, $MoS_2$, or the like, which is a two-dimensional material, may be bonded to the graphene layer 40, thereby forming a spin-momentum locking band structure at interfaces between the first TMDC pattern 51 and the second TMDC pattern 52 and the graphene layer 40. This property is well known in theory, and the present disclosure generates and controls a spin-biased spin current between the first TMDC pattern 51 and the second TMDC pattern 52 using a band structure having spin dependency, which is formed to have a conduction band CB and a valence band VB as shown in FIGS. 2 and 3, thereby performing on/off operations.

Figure 4:
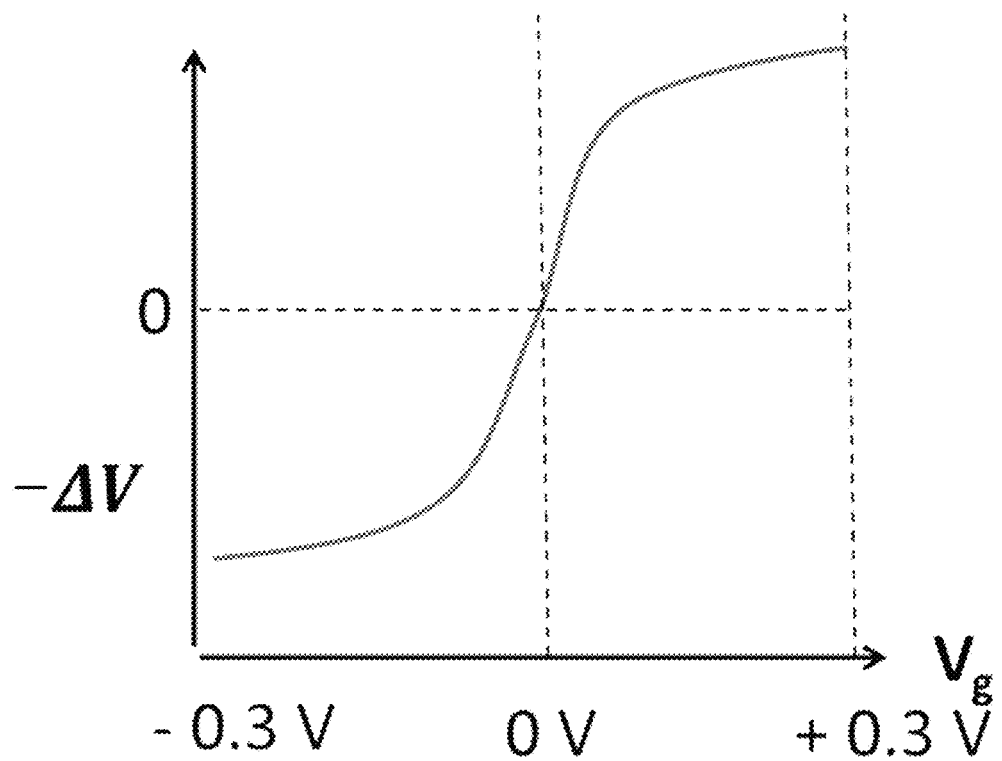
FIG. 4 is a graph for explaining an output voltage (a transfer curve) depending on the voltage applied to a gate electrode of a graphene spin transistor in a Rashba spin FET mode according to an embodiment of the present disclosure.
Figure 7:
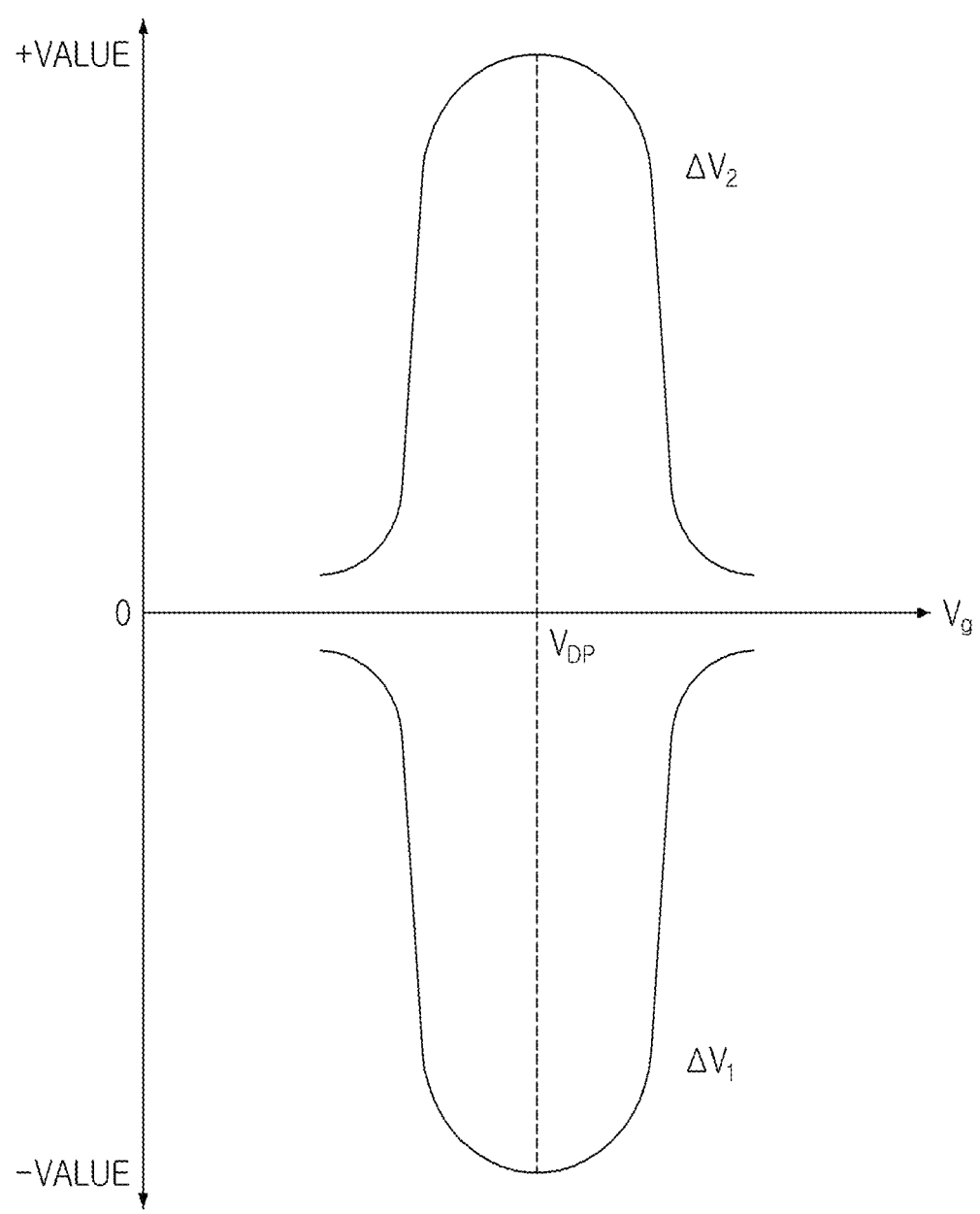
FIG. 7 is a graph for explaining an output voltage (a transfer curve) depending on a voltage applied to a gate electrode of a graphene spin transistor in a spin Hall FET mode according to an embodiment of the present disclosure.

To this end, in the present disclosure, the position of the Fermi level is adjusted depending on the voltage applied to the gate electrode 20, thereby controlling on/off operations. In addition, the on/off operations depending on the voltage applied to the gate electrode 20 make a definite difference in a transfer curve of the output voltage difference between two operation modes (a Rashba spin FET mode and a spin Hall FET mode) (for example, the voltage difference between a first area 61 and a second area 62 in FIG. 1) depending on the voltage applied to the gate electrode 20, as will be described below. More specifically, FIG. 4 shows a transfer curve of the graphene spin transistor 100 of the present disclosure in a Rashba spin FET mode, and FIG. 7 shows a transfer curve of the graphene spin transistor 100 of the present disclosure in a spin Hall FET mode.

First, the Rashba spin FET mode of the graphene spin transistor 100 in the present disclosure will be described in more detail with reference to FIGS. 2 to 4. Subsequently, the spin Hall FET mode of the graphene spin transistor 100 in the present disclosure will be described in more detail with reference to FIGS. 6 and 7.

Figure 2:
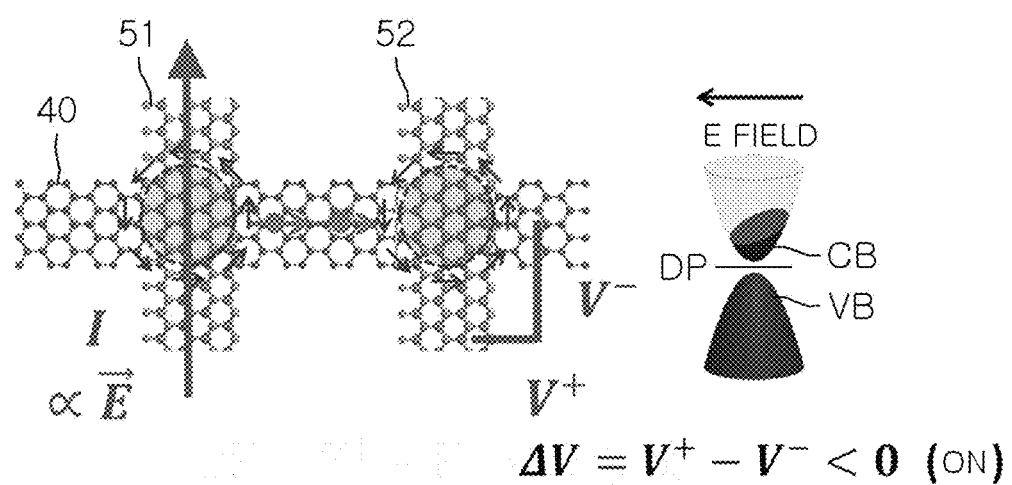
FIG. 2 is a view for explaining a direct operation of a graphene spin transistor in a Rashba spin FET mode according to an embodiment of the present disclosure.
Figure 3:
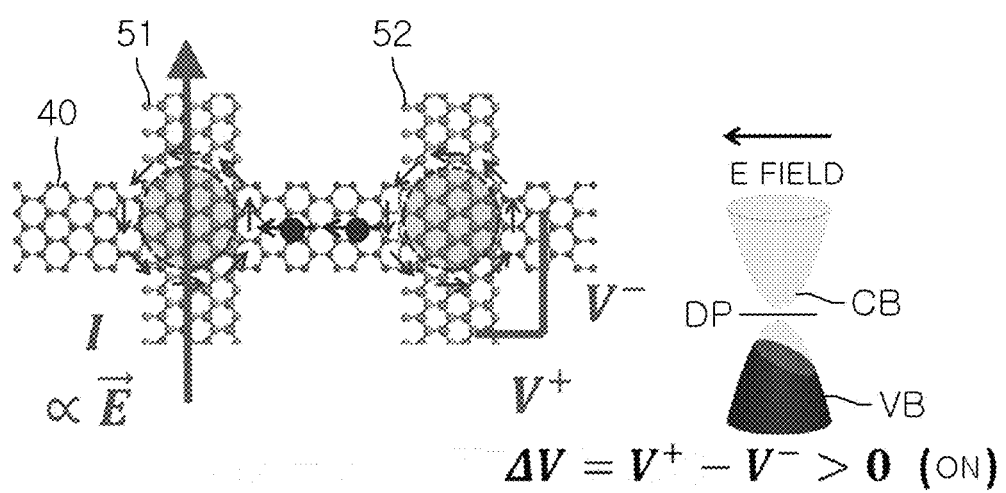
FIG. 3 is a view for explaining an inverse operation of a graphene spin transistor in a Rashba spin FET mode according to an embodiment of the present disclosure.

FIG. 2 is a view for explaining a direct operation of a graphene spin transistor 100 in a Rashba spin FET mode according to an embodiment of the present disclosure. FIG. 3 is a view for explaining an inverse operation of a graphene spin transistor 100 in a Rashba spin FET mode according to an embodiment of the present disclosure. FIG. 4 is a graph for explaining an output voltage (a transfer curve) depending on a voltage applied to a gate electrode of a graphene spin transistor 100 in a Rashba spin FET mode according to an embodiment of the present disclosure.

In the case where the graphene spin transistor 100 according to an embodiment of the present disclosure is to be operated in a Rashba spin FET mode, a current is applied to the first TMDC pattern 51. For example, as shown in FIG. 1, a current I is applied to the first TMDC pattern 51 so as to flow in the transverse direction across the graphene layer 40.

At this time, in the case where the graphene spin transistor 100 according to an embodiment of the present disclosure is to be operated in the Rashba spin FET mode, when the gate voltage Vg is 0 V, that is, if the Fermi level is positioned in a band gap between the valence band VB and the conduction band CB on the junction surfaces between the graphene layer 40 and the first TMDC pattern 51 and the second TMDC pattern 52, a spin current is not generated. Therefore, the output voltage of the graphene spin transistor 100, that is, the voltage difference ΔV between a first area 61 and a second area 62 in FIG. 1 is 0V (see FIG. 4), which is defined as an off state. In other words, if the Fermi level is positioned in the spin orbit gap of the graphene layer 40, there is no spin polarization in the band, so that spin current does not flow, thereby realizing the off state of the transistor 100. In this case, the first area 61 (V+) may be any point in the second TMDC pattern 52 in which spin electrons are accumulated/depleted (the number of spin electrons varies) depending on the gate voltage Vg, and the second area 62 (V−) may be any point in the graphene layer 40, which is positioned adjacent to the second TMDC pattern 52 in the opposite direction of the first TMDC pattern 51, but the present disclosure is not necessarily limited thereto.

In addition, in the case where the graphene spin transistor 100 according to an embodiment of the present disclosure is to be operated in the Rashba spin FET mode, as shown in FIG. 2, when a current I (electric field E) is applied and a gate voltage Vg is greater than 0V, that is, if the Fermi level is positioned above the conduction band CB, the output voltage of the graphene spin transistor 100 {e.g., the voltage difference ($^\Delta$V) between the first area 61 (V+) and the second area 62 (V−) in FIG. 1} becomes smaller than 0 (see FIG. 4). This is defined as a first on state corresponding to a direct operation. This is produced by the Rashba-Edelstein effect in which an electric field is generated by tilting of the band structure of materials on the junction surfaces between the graphene layer 40 and the first TMDC pattern 51 and the second TMDC pattern 52, in which up-spin electrons and down-spin electrons are generated due to spin-momentum locking in a Rashba type, and in which injection/diffusion of spin electrons (excessive spin electrons generated on the junction surface between the graphene layer 40 and the first TMDC pattern 51) occurs from the first TMDC pattern 51, to which the current I (electric field E) is applied, to the second TMDC pattern 52 through the graphene layer 40.

On the other hand, spin detection is performed on the opposite side. That is, as shown in FIG. 2, while the flow of spin electrons is induced due to the diffusion of spin electrons of the graphene layer 40 using the Rashba-Edelstein effect, the direction of the spin current is determined toward the right by a voltage Vg, which is greater than 0 V, applied to the gate electrode 20, so that the first area 61 (V+) of the second TMDC pattern 52, in which the spin electrons are accumulated and the amount thereof is increased, has a relatively low potential, and the voltage difference ($^\Delta$V) between the first area 61 (V+) and the second area 62 (V−) of the graphene layer 40, which is positioned adjacent to the second TMDC pattern 52 in the opposite direction of the first TMDC pattern 51, becomes smaller than 0 (see FIG. 4).

On the other hand, in the case where the graphene spin transistor 100 of the present disclosure is to be operated in the Rashba spin FET mode, as shown in FIG. 3, when a current I (electric field E) is applied and a gate voltage Vg is less than 0 V, that is, if the Fermi level is positioned below the valence band VB, the output voltage of the graphene spin transistor 100 {e.g., the voltage difference ($^\Delta$V) between the first area 61 (V+) and the second area 62 (V−) in FIG. 1} becomes greater than 0 (see FIG. 4). This is defined as a second on state corresponding to an inverse operation. This is also produced by the Rashba-Edelstein effect in which an electric field is generated by tilting of the band structure of materials on the junction surfaces between the graphene layer 40 and the first TMDC pattern 51 and the second TMDC pattern 52, in which up-spin electrons and down-spin electrons are generated due to spin-momentum locking in a Rashba type, and in which injection/diffusion of spin electrons (excessive spin electrons generated on the junction surface between the graphene layer 40 and the first TMDC pattern 51) occurs from the second TMDC pattern 52 to the first TMDC pattern 51, to which the current I (electric field E) is applied, through the graphene layer 40. Spin detection is performed on the opposite side. That is, as shown in FIG. 3, while the flow of spin electrons is induced by diffusion of spin electrons of the graphene layer 40 using the Rashba-Edelstein effect, the direction of the spin current is determined toward the left by a voltage Vg, which is smaller than 0 V, applied to the gate electrode 20, so that the first area 61 (V+) of the second TMDC pattern 52, in which the spin electrons are depleted and the amount thereof is reduced (for example, it is similar to injection of holes), has a relatively high potential, and the voltage difference ($^\Delta$V) between the first area 61 (V+) and the second area 62 (V−) of the graphene layer 40, which is adjacent to the second TMDC pattern 52 in the opposite direction of the first TMDC pattern 51, becomes greater than 0 (see FIG. 4).

Figure 5:
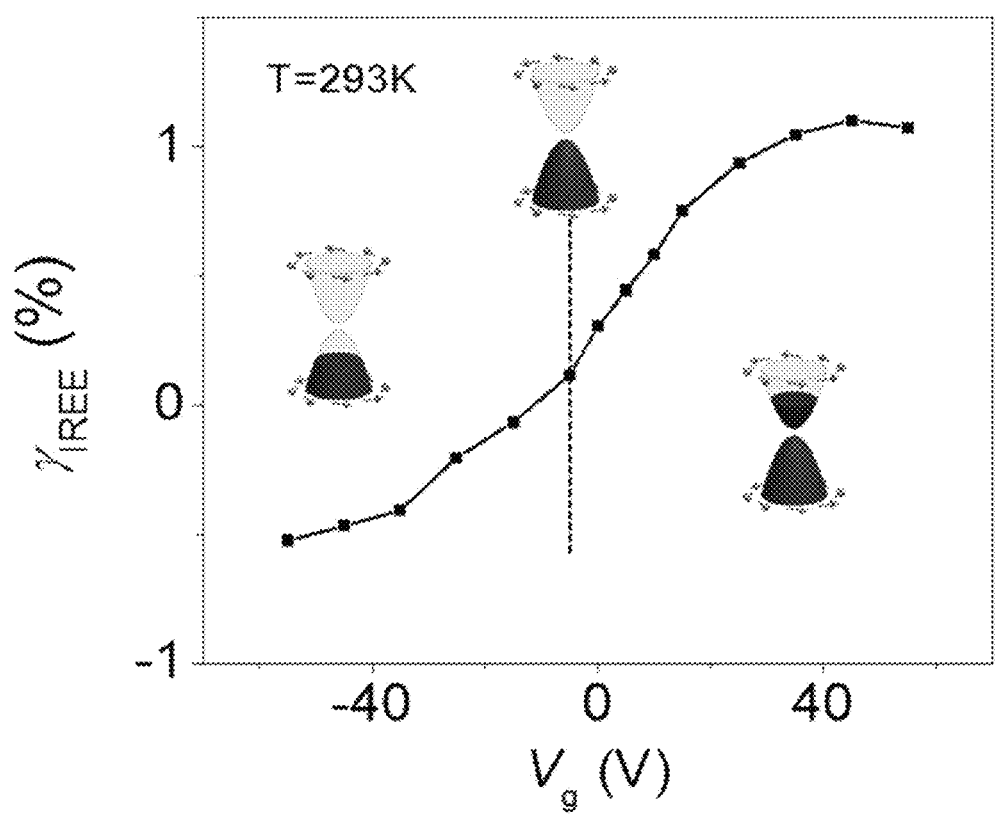
FIG. 5 is a graph for explaining spin-charge conversion efficiency of a graphene spin transistor in a Rashba spin FET mode according to an embodiment of the present disclosure.

FIG. 5 is a graph for explaining the spin-charge conversion efficiency of the graphene spin transistor 100 in a Rashba spin FET mode according to an embodiment of the present disclosure.

As shown in Equation 1 below, the Rashba-Edelstein spin-charge conversion efficiency $\gamma_{IREE}(\%)$, which is calculated as the ratio of a charge current to a 2D-spin current in the graphene layer 40 of the graphene spin transistor 100 in a Rashba spin FET mode according to an embodiment of the present disclosure, increases more in response to an increase in the positive gate voltage Vg than to an increase in the negative gate voltage Vg, as shown in FIG. 5. Complementary operation may be possible through integration of circuits including a plurality of graphene spin transistors 100 in series or parallel in consideration of both the spin-charge conversion efficiency in FIG. 5 and the transfer curve in FIG. 4. This will play an important role in replacing CMOS circuits in the non-memory semiconductor field or the next-generation ultra-low power electrical and electronic fields.

$$\gamma_{IREE}(\%) \equiv \frac{J_C(2D)}{J_S(2D)} \quad \text{[Equation 1]}$$

Meanwhile, the spin Hall FET mode of the graphene spin transistor 100 according to an embodiment of the present disclosure will be described in more detail with reference to FIGS. 6 and 7 below. The type of mode is determined from among the spin Hall FET and the Rashba spin FET according to the interaction between the materials specified for the first TMDC pattern 51 and the second TMDC pattern 52 and the graphene layer 40. In other words, one of either the Rashba-Edelstein effect on the graphene/TMDC junction surface or the spin Hall effect of the TMDC will be dominant depending on the type of material for the TMDC, so that the graphene spin transistor 100 may operate in one of the two spin FET modes.

Figure 6:
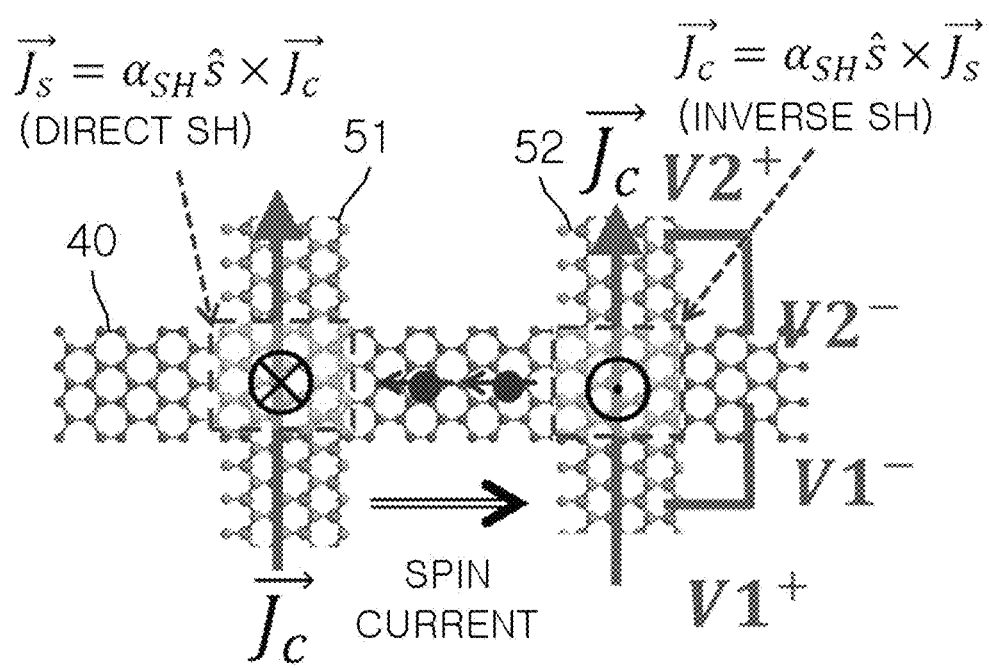
FIG. 6 is a view for explaining direct and inverse operations of a graphene spin transistor in a spin Hall FET mode according to an embodiment of the present disclosure.

FIG. 6 is a view for explaining direct and inverse operations of a graphene spin transistor 100 in a spin Hall FET mode according to an embodiment of the present disclosure. FIG. 7 is a graph for explaining an output voltage (a transfer curve) depending on a voltage applied to a gate electrode of a graphene spin transistor 100 in a spin Hall FET mode according to an embodiment of the present disclosure.

In the case where the graphene spin transistor 100 according to an embodiment of the present disclosure is to be operated in a spin Hall FET mode, current may be applied to the first TMDC pattern 51. For example, as shown in FIG. 1, current may be applied to the first TMDC pattern 51 in the transverse direction across the graphene layer 40 (current density Jc).

In this case, the directivity $\hat{s}$ of a spin electron is determined to be the direction $\otimes$ toward the inside, as shown in FIG. 6, due to the spin Hall effect of the material of the first TMDC pattern 51 having a density Jc of current flowing therethrough, and a spin current flows in the direction perpendicular thereto according to Equation 2 below. Here, in Equation 2, $\hat{S}$ indicates the up/down direction of a spin electron, and $\alpha_{sH}$ indicates a spin Hall angle (charge current-spin current conversion rate) determined by the property of the interface between the graphene layer 40 and the first TMDC pattern 51. Accordingly, accumulation of spins occurs on the surface of the TMDC bonded to the graphene layer 40, and excessive spins diffuse toward the first TMDC pattern 51 along the graphene layer 40 as shown in FIG. 6.

$$\vec{J_s} = \alpha_{SH} \hat{s} \times \vec{J_c} \quad \text{[Equation 2]}$$

In this case, if the resistance of the graphene layer 40 is controlled by the voltage Vg of the gate electrode 20, it is possible to control the spin current absorbed into the second TMDC pattern 52 according to the resistance ratio between the graphene layer 40 and the second TMDC pattern 52, thereby adjusting the voltage generated in the second TMDC pattern 52 by the inverse spin Hall effect. The spin current, which diffuses along the graphene layer 40 and is then absorbed into the second TMDC pattern 52, induces a current Jc in the second TMDC pattern 52 by the inverse spin Hall effect according to Equation 3, and the charges accumulated by the current generate a voltage ΔV1 between the first area 61 (V1+) and the second area 62 (V1−). In Equation 3, $\hat{S}$ indicates the up/down direction of a spin electron, and $\alpha_{sH}$ indicates an inverse spin Hall angle (spin current-charge current conversion rate) determined by the properties of the second TMDC pattern 52. In this case, the inverse spin Hall angle is equal to the spin Hall angle according to the Onsager reciprocal relationship.

$$\vec{J}_c = \alpha_{SH} \vec{s} \times \vec{J}_s \qquad \text{[Equation 3]}$$

If the gate voltage Vg is a voltage $V_{DP}$ that causes the Fermi level to be positioned in the Dirac point (DP) between the valence band VB and the conduction band CB in the graphene layer 40 (for example, if it is 0V), the output voltage of the graphene spin transistor 100 {e.g., the voltage difference ΔV1 between the first area 61 and the second area 62 in FIG. 1) is maximized (see FIG. 7). This is due to the fact that the spin current is absorbed into the second TMDC pattern 52 rather than flowing to the second area 62 along the graphene layer 40 having high resistance because the resistance of the graphene layer 40 is maximized at the DP. This is defined as the on state of the spin Hall FET. If a current Jc is applied to the first TMDC pattern 51 as shown in FIG. 6, and if the gate voltage Vg is greater than or less than $V_{DP}$ (see FIG. 7) (the Fermi level is far from the DP), the output voltage of the graphene spin transistor 100 {e.g., the voltage difference ΔV1 between the first area 61 (V1+) and the second area 62 (V1−) in FIG. 1} gradually approaches zero (see FIG. 7). This is defined as an off state. If a voltage Vg greater or less than $V_{DP}$ is applied to the gate electrode 20, the resistance of the graphene layer 40 is gradually reduced, so the ratio at which the spin current flowing along the graphene layer 40 is absorbed into the second TMDC pattern 52 is gradually reduced, and the spin current is likely to flow to the second area 62 along the low-resistance graphene layer 40, thereby reducing the voltage difference between the first area 61 and the second area 62 by the inverse spin Hall effect (see FIG. 7).

As described above, in the spin Hall FET mode, the Fermi level of the graphene layer 40 is in the on state at the Dirac point due to the gate voltage Vg, and switches to the off state when it goes away from the Dirac point. The spin Hall FET mode is different from the Rashba spin FET mode in that the voltage sign is constant in the on state. As shown in FIG. 7, the magnitude of the voltage is adjustable in the on state depending on the gate voltage Vg.

Meanwhile, the graphene spin transistor 100 of the present disclosure may perform a complementary operation as shown in FIG. 6. That is, while generating a first voltage difference (ΔV1=V1+−V1−) between the first area 61 of the second TMDC pattern 52 and the second area 62 of the graphene layer 40, which is adjacent to the second TMDC pattern 52 in the direction opposite the first TMDC pattern 51, as described above, a second voltage difference (ΔV2=V2+−V2−) may be generated between a third area 71 of the second TMDC pattern 52 (the first area 61 and the third area 71 are positioned at opposite points in the direction across the graphene layer 40) and a fourth area 72 of the graphene layer 40. In this case, the second area 62 and the fourth area 72 may be positioned at the same point.

The above second voltage difference (ΔV2=V2+−V2−) occurs at the same time as the first voltage difference (ΔV1=V1+−V1−) occurring due to the above spin Hall effect. However, as described above, when the current Jc is induced in the second TMDC pattern 52 according to Equation 3, the electric charges accumulated by the current generate a negative value of voltage ΔV1 between the first area 61 (V1+) and the second area 62 (V1−), but generate a positive value of voltage ΔV2 between the third area 71 (V2+) and the fourth area 72 (V2−) according thereto (see FIG. 7).

The graphene spin transistor 100 of the present disclosure may simultaneously generate output voltages of opposite polarities depending on the position of the second TMDC pattern 52 in the spin Hall FET mode. The feature in which voltages of opposite polarities are simultaneously output by the current applied to the first TMDC pattern 51 depending on the position of the second TMDC pattern 52 may be effectively applied to circuits that require an inversion operation in integration of circuits including a plurality of graphene spin transistors 100 combined in series or parallel.

In addition, in the graphene spin transistor 100 according to an embodiment of the present disclosure, unless stated otherwise such as the case where the gate insulating film 30 is 1 to 10 nm (preferably, 3 nm) thick, the remaining elements such as the gate electrode 20, the graphene layer 40, the first TMDC pattern 51, the second TMDC pattern 52, and the like may be 1 to 100 nm thick. Although the graphene spin transistor 100 according to an embodiment of the present disclosure is described as being formed of components on the nanometer scale (e.g., 1 to 100 nm), the present disclosure is not necessarily limited thereto, and the components of the graphene spin transistor 100 according to an embodiment of the present disclosure may be increased in size beyond the nanometer scale to a micrometer or millimeter scale according to design purposes.

Figure 8:
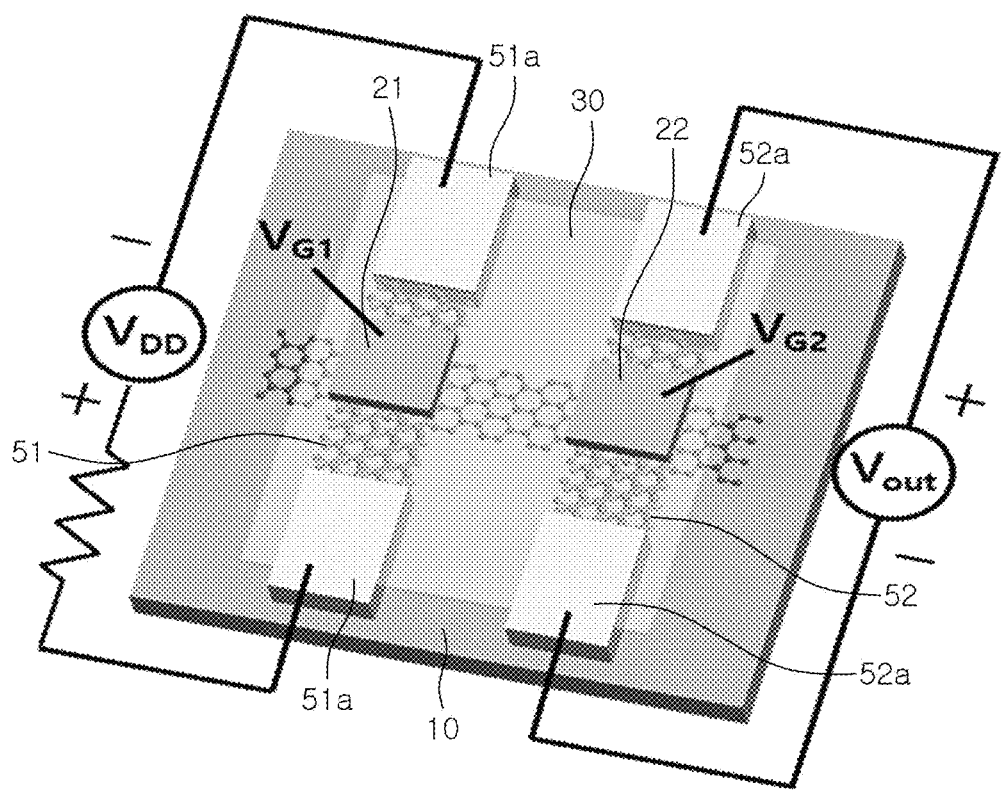
FIG. 8 is a view for explaining the structure of a graphene spin transistor according to an embodiment of the present disclosure.

In addition, FIG. 8 illustrates another structure of a graphene spin transistor 100 according to an embodiment of the present disclosure.

As shown in FIG. 8, the graphene spin transistor 100 according to an embodiment of the present disclosure may be configured to include a substrate 10, a graphene layer 40 formed on the substrate 10, a first TMDC pattern 51 and a second TMDC pattern 52 formed to cross the graphene layer 40 in the transverse direction thereof so as to be spaced a predetermined distance apart from each other in the longitudinal direction thereof, a first TMDC electrode 51a for the first TMDC pattern 51, a second TMDC electrode 52a for the second TMDC pattern 52, a first gate electrode 21 formed in the area in which the first TMDC pattern 51 intersects the graphene layer 40, a second gate electrode 22 formed in the area where the second TMDC pattern 52 intersects the graphene layer 40, and a gate insulating film 30 for insulating the first gate electrode 21 and the second gate electrode 22. However, the present disclosure is not necessarily limited thereto, and the graphene spin transistor 100 according to an embodiment of the present disclosure may be implemented by modifying the structure shown in FIG. 8.

In this case, as described in detail above, the graphene spin transistor 100 according to an embodiment of the present disclosure generates, controls, and detects a spin current using the Rashba-Edelstein effect (or the spin Hall effect).

In addition, although the case of using the Rashba-Edelstein effect will be primarily described below, the present disclosure is not necessarily limited thereto.

More specifically, as shown in FIG. 8, in the graphene spin transistor 100 according to an embodiment of the present disclosure, the first TMDC pattern 51 and the second TMDC pattern 52 may be bonded to the graphene layer 40, and one of these channels may be used to generate a spin current according to the direct Rashba-Edelstein effect, and the other channel may be used to detect a spin current according to the inverse Rashba-Edelstein effect.

Figure 9:
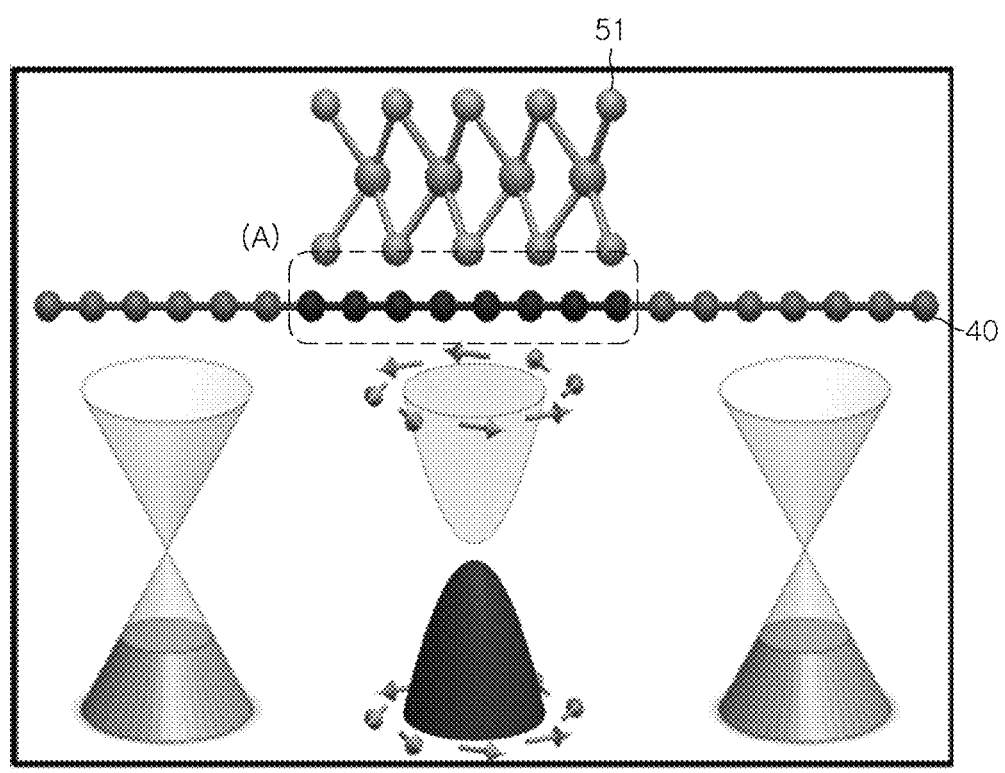
FIG. 9 is a view for explaining the Rashba band structure in a graphene spin transistor according to an embodiment of the present disclosure.

In this case, if a transition metal dichalcogenide (TMDC) such as $TaS_2$, $WS_2$, or the like is bonded to the graphene layer 40, spin-splitting occurs in a graphene band of the bonding area in the energy direction, thereby resulting in spin-momentum locking in a Rashba form as shown in FIG. 9.

More specifically, FIG. 9 describes a Rashba band structure generated by the proximity effect between the graphene and the transition metal dichalcogenide (TMDC). Typically, the pristine graphene has a spin degeneracy band structure without an energy gap, but the graphene band in the junction area has a Rashba spin-biased band structure according to the proximity effect of a transition metal dichalcogenide (TMDC) having high spin-orbit binding energy, thereby producing a correlation between the spin and the momentum.

That is, it is difficult to generate and detect a spin current in the conventional graphene because the spin-orbit binding energy is very low at about 10 μeV, but, in the present disclosure, the spin-orbit binding energy of the graphene may be increased by more than 100 times according to the proximity effect by bonding a transition metal dichalcogenide (TMDC) having high spin-orbit binding energy to the graphene, so that a Rashba spin-biased band may be generated, thereby bringing about a spin-momentum correlation, that is, spin-momentum locking.

Accordingly, in the graphene spin transistor 100 according to an embodiment of the present disclosure, if an electric field is applied to the junction between the graphene and the TMDC, a spin current is accumulated at the junction of the two materials and diffuses through the graphene due to the direct Rashba-Edelstein effect without a separate magnetic field or magnetic material, and a spin current is able to be detected at the other graphene/TMDC junction according to the inverse Rashba-Edelstein effect without a separate magnetic field or magnetic material.

Therefore, in the graphene spin transistor 100 according to an embodiment of the present disclosure, a Rashba spin band structure in which spin-momentum is fixed may be induced by bonding a transition metal dichacogenide (TMDC) having high spin-orbit binding energy to the graphene, thereby realizing mutual conversion between the charge current and the spin current at room temperature.

In this case, the operation of generating a spin current by an electric field without a separate magnetic field or magnetic material using the spin-dependent Rashba band structure described above may be referred to as a "direct Rashba-Edelstein effect", whereas the operation of detecting a spin current through the Rashba spin-biased band formed in the graphene layer 40 and the TMDC pattern may be referred to as an "inverse Rashba-Edelstein effect".

Accordingly, the graphene spin transistor 100 according to an embodiment of the present disclosure is able to reduce power consumption by 100 times or more compared to a conventional CMOS transistor, and is able to operate, including complementary operation, at room temperature using an electric field without a separate magnetic field or magnetic material.

Furthermore, in the graphene spin transistor 100 according to an embodiment of the present disclosure, as shown in FIG. 8, the Fermi levels of respective channels generated in the junction areas (A in FIG. 9) between the graphene layer 40 and the first TMDC pattern 51 and the second TMDC pattern 52 may be individually adjusted using two independent gate electrodes (the first gate electrode 21 and the second gate electrode 22).

Accordingly, the graphene spin transistor 100 according to an embodiment of the present disclosure may implement a new driving method in which, if the Fermi level of the graphene layer 40 is positioned in a spin-orbit gap (in the bandgap shown in FIG. 9) in at least any one of the two spin channels, spin current does not flow, so the graphene spin transistor 100 is in an off state.

On the other hand, if the Fermi level is positioned outside the energy gap of a spin-biased band in both of the spin channels, the graphene spin transistor 100 is in an on state.

Furthermore, in the graphene spin transistor 100 according to an embodiment of the present disclosure, it is possible to implement a p-type spin transistor (which is turned on when the gate voltage is 0 V) through chemical doping of the graphene layer 40 using organic molecules such as F4-TCNQ and the like. In addition, as an embodiment of the present disclosure, the gate insulating film 30 may be implemented by capping boron nitride (hBN) to have a thickness of 2 nm.

Figure 10:
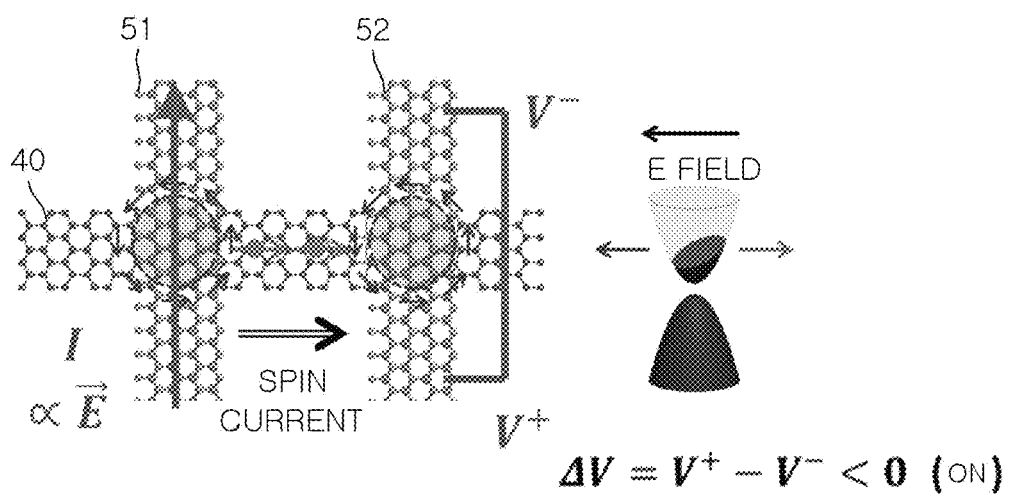
FIG. 10 is a view for explaining a direct operation of a graphene spin transistor in a Rashba spin FET mode according to an embodiment of the present disclosure.
Figure 11:
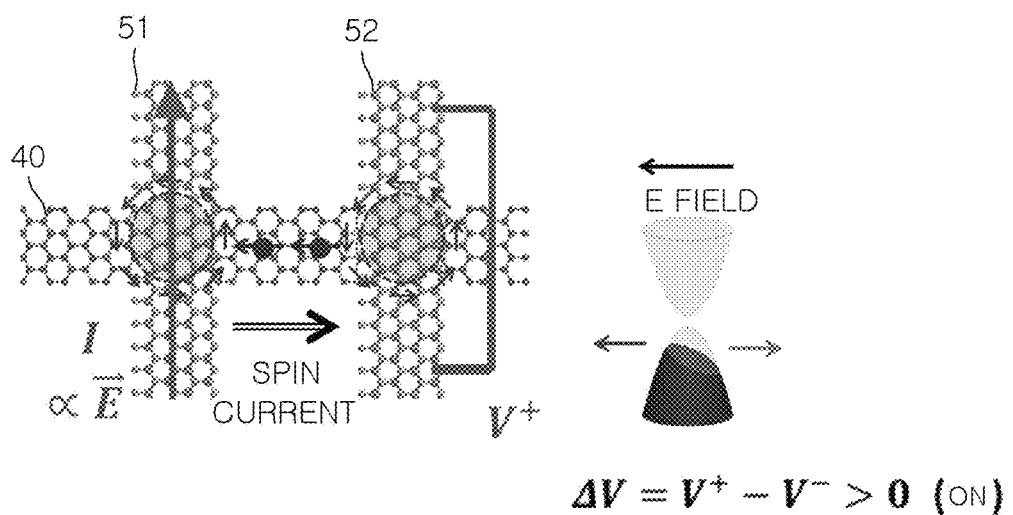
FIG. 11 is a view for explaining an inverse operation of a graphene spin transistor in a Rashba spin FET mode according to an embodiment of the present disclosure.
Figure 12:
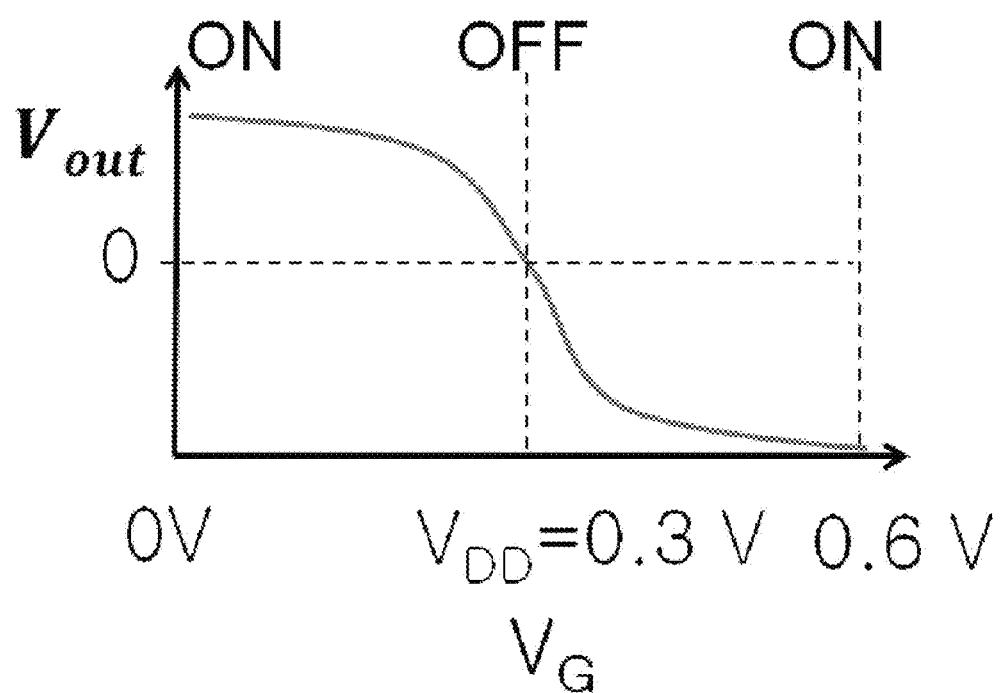
FIG. 12 is a graph for explaining an output voltage (a transfer curve) depending on a voltage applied to a gate electrode of a graphene spin transistor in a Rashba spin FET mode according to an embodiment of the present disclosure.

More specifically, FIG. 10 describes a direct operation of a graphene spin transistor 100 in according to an embodiment of the present disclosure, FIG. 11 describes an inverse operation of a graphene spin transistor 100 according to an embodiment of the present disclosure, and FIG. 12 illustrates a transfer curve showing an output voltage depending on a voltage applied to a gate electrode of a graphene spin transistor 100 according to an embodiment of the present disclosure.

In this regard, as described in detail with reference to FIGS. 2 to 4, the graphene spin transistor 100 according to an embodiment of the present disclosure generates and controls a spin-biased spin current between the first TMDC pattern 51 and the second TMDC pattern 52 using a band structure having spin dependency, which is formed to have a conduction band CB and a valence band VB, thereby performing on/off operations.

More specifically, the graphene spin transistor 100 according to an embodiment of the present disclosure controls on/off operations by adjusting the Fermi level of each channel depending on the gate voltage applied to each of the first gate electrode 21 and the second gate electrode 22.

In a more detailed example, a transfer curve for direct operation of the graphene spin transistor 100 according to an embodiment of the present disclosure may be represented by a graph of the voltage difference between both longitudinal ends of the second TMDC pattern 52 (i.e., the voltage difference between the second TMDC electrodes in FIG. 8) depending on the voltage applied to the first gate electrode 21 in FIG. 10.

In addition, a transfer curve for inverse operation of the graphene spin transistor 100 according to an embodiment of the present disclosure may be represented by a graph of the voltage difference between both longitudinal ends of the second TMDC pattern (i.e., the voltage difference between the second TMDC electrodes in FIG. 8) depending on the voltage applied to the first gate electrode 21 in FIG. 11.

In addition, FIG. 12 illustrates a transfer curve showing the output voltage depending on the voltage applied to a gate electrode of the graphene spin transistor 100 according thereto.

Figure 13:
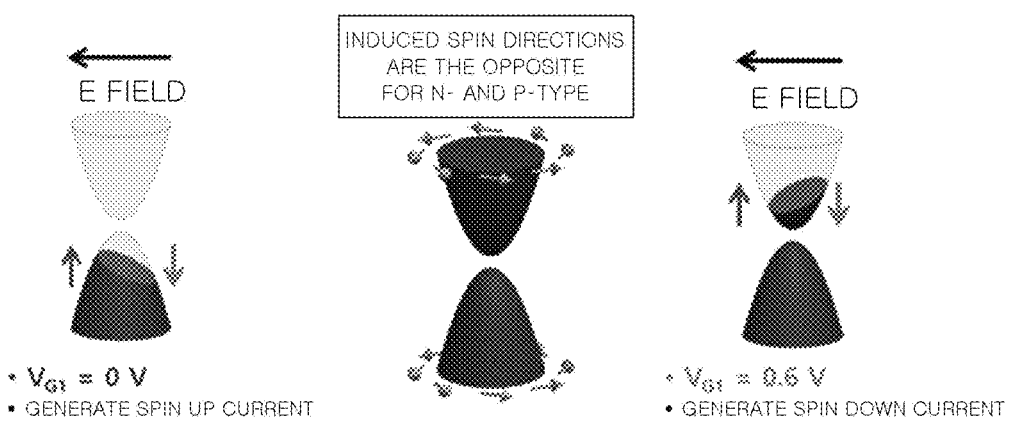
FIGS. 13 and 14 are views for explaining a complementary operation of a graphene spin transistor according to an embodiment of the present disclosure.
Figure 14:
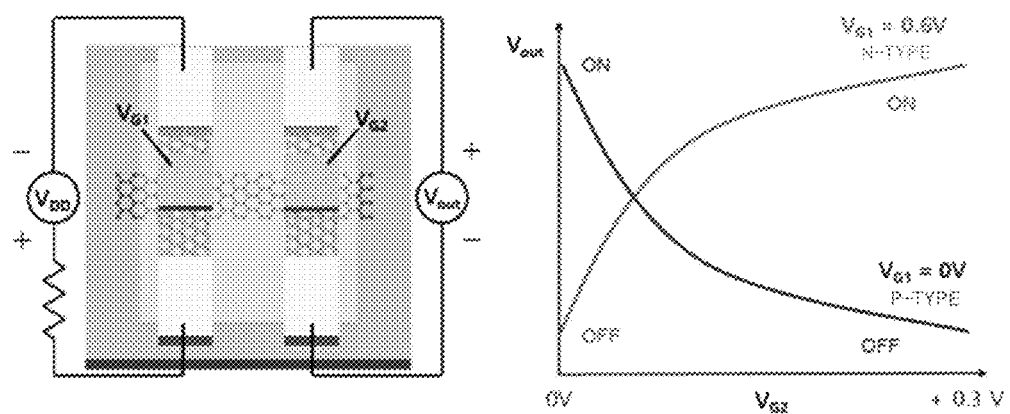

In addition, in the graphene spin transistor 100 according to an embodiment of the present disclosure, since the spin winding direction in the graphene Rashba biased band is the same between the conduction band CB and the valence band VB as shown in FIG. 13, it is possible to generate spin currents in different directions from each other by positioning the Fermi level in the conduction band CB or the valence band VB of the graphene through adjustment of the gate voltage. Accordingly, in the graphene spin transistor 100 according to an embodiment of the present disclosure, it is possible to implement a complementary operation of the graphene spin transistor 100 as shown in FIG. 14 by adjusting the generated spin direction while applying the voltage to the gate electrode 20 on one side or the opposite side.

Furthermore, as an embodiment of the present disclosure, a logic element (logic gate) may be implemented using the graphene spin transistor 100.

More specifically, a logic element using the graphene Rashba spin transistor 100 according to an embodiment of the present disclosure may include a gate electrode 20, a gate insulating film 30 for insulating the gate electrode 20, a graphene layer 40 formed to face the gate electrode 20 based on the gate insulating film 30, and a first TMDC pattern 51 and a second TMDC pattern 52 formed to cross the graphene layer 40 in the transverse direction thereof so as to be spaced a predetermined distance apart from each other in the longitudinal direction thereof, and may operate by inducing a spin current due to spin-biased electrons between the first TMDC pattern 51 and the second TMDC pattern 52 using a spin-momentum locking band structure formed at each interface between the graphene layer 40 and the first TMDC pattern 51, and between the graphene layer 40 and the second TMDC pattern 52.

In this case, the logic element using the graphene spin transistor 100 according to an embodiment of the present disclosure may generate excessive spin electrons on the junction surface between the graphene layer 40 and the first TMDC pattern 51 according to the Rashba-Edelstein effect by the current applied to the first TMDC pattern 51 and the voltage applied to the gate electrode 20, and may operate by controlling the spin direction of the electrons generated between the graphene layer 40 and the first TMDC pattern 51 (i.e., the Rashba spin FET mode).

In this case, the gate electrode 20 may include a first gate electrode 21 formed in the area where the first TMDC pattern 51 intersects the graphene layer 40, and a second gate electrode 22 formed in the area where the second TMDC pattern 52 intersects the graphene layer 40.

Accordingly, in the logic element using the graphene spin transistor 100 according to an embodiment of the present disclosure, the voltages applied to the first gate electrode 21 and the second gate electrode 22 may be individually controlled, thereby independently controlling the on/off operations of two channels.

Figure 15:
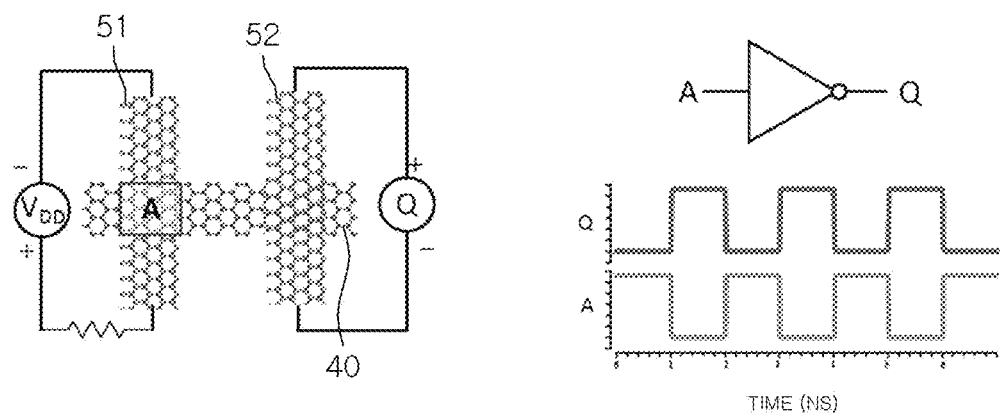
FIGS. 15 to 18 are views for explaining the operation of a logic gate using a graphene Rashba spin transistor according to an embodiment of the present disclosure.

For example, FIG. 15 illustrates the case of implementing an inverter using a graphene spin transistor 100 according to an embodiment of the present disclosure.

More specifically, as shown in FIG. 15, an inverter may be implemented by the voltage applied to the first gate electrode 21 of the graphene spin transistor 100 according to an embodiment of the present disclosure as an input signal (A in FIG. 15) and the voltage difference between both longitudinal ends of the second TMDC pattern (that is, the voltage difference between the second TMDC electrodes 52a) as an output signal (Q in FIG. 15).

Here, as shown in FIG. 15, the voltage difference between both longitudinal ends of the second TMDC pattern 52 is generated according to the input signal (A in FIG. 15) applied to the first gate electrode 21 while $V_{DD}$ is input to both ends of the first TMDC pattern 51. In this case, the output signal of the inverter (Q in FIG. 15) is obtained by inverting the input signal (A in FIG. 15) (for example, an input of HIGH=0.3 V is inverted and output as LOW=0 V).

In addition, in a logic element using a graphene spin transistor 100 according to an embodiment of the present disclosure, the graphene layer 40 may have a structure in which one side thereof is divided into two or more branches.

Accordingly, a logic element using a graphene spin transistor 100 according to an embodiment of the present disclosure has gate electrodes in two or more areas in which two or more branches of the graphene layer 40 intersect the TMDC pattern, thereby implementing a logic gate capable of processing two or more input signals.

Figure 16:
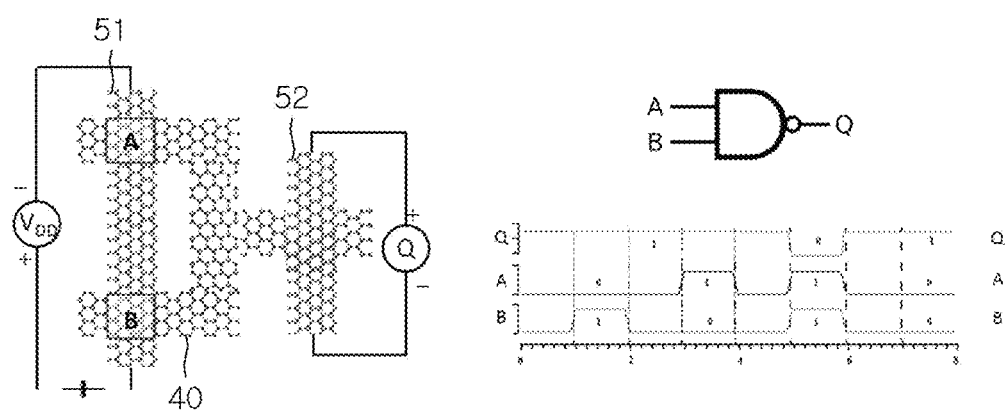

With regard to this, FIG. 16 illustrates the case where a NAND gate is implemented using a graphene spin transistor 100 according to an embodiment of the present disclosure.

More specifically, as shown in FIG. 16, in the graphene spin transistor 100 according to an embodiment of the present disclosure, the graphene layer 40 may have a structure in which one side thereof is divided into two branches, and two first gate electrodes 21 may be formed in two areas in which the two branches of the graphene layer 40 intersect the first TMDC pattern 51.

Accordingly, in FIG. 16, a NAND gate may be implemented by the voltages applied to the two first gate electrodes 21 as input signals (A and B in FIG. 16) and the voltage difference between both longitudinal ends of the second TMDC pattern 52 (that is, the voltage difference between the second TMDC electrodes 52a) as an output signal (Q in FIG. 16).

Here, as shown in FIG. 16, the voltage difference between both longitudinal ends of the second TMDC pattern 52 is generated according to the input signals (A and B in FIG. 16) input to the two first gate electrodes 21 while $V_{DD}$ is input to both ends of the first TMDC pattern 51, thereby outputting a NAND output signal (Q in FIG. 16) in response to the input signals (A and B in FIG. 16).

Figure 17:
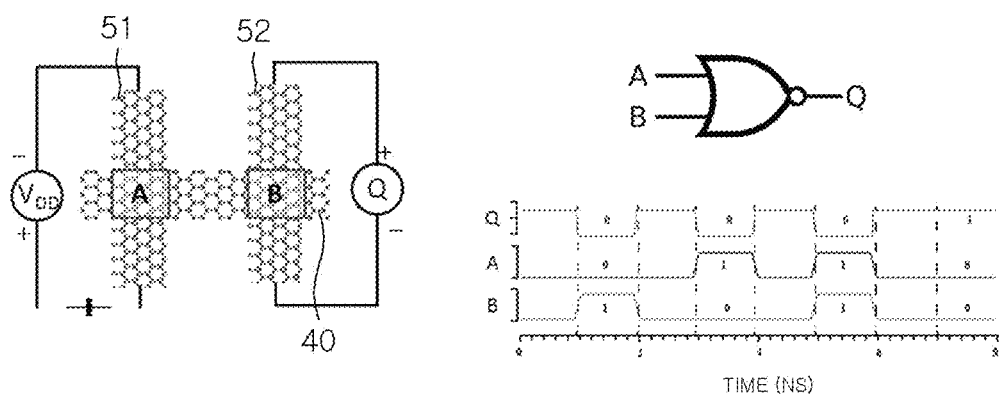

In addition, FIG. 17 illustrates the case where a NOR gate is implemented using a graphene spin transistor 100 according to an embodiment of the present disclosure.

More specifically, as shown in FIG. 17, a NOR gate may be implemented using the voltages applied to the first gate electrode 21 and the second gate electrode 22 of the graphene spin transistor 100 according to an embodiment of the present disclosure as input signals (A and B in FIG. 17) and the voltage difference between both longitudinal ends of the second TMDC pattern 52 (that is, the voltage difference between the second TMDC electrodes 52a) as an output signal (Q in FIG. 17).

Here, as shown in FIG. 17, the voltage difference between both longitudinal ends of the second TMDC pattern 52 is generated according to the input signals (A and B in FIG. 17) applied to the first gate electrode 21 and the second gate electrode 22 while $V_{DD}$ is input to both ends of the first TMDC pattern 51, thereby outputting a NOR output signal (Q in FIG. 17) in response to the input signals (A and B in FIG. 17).

Figure 18:
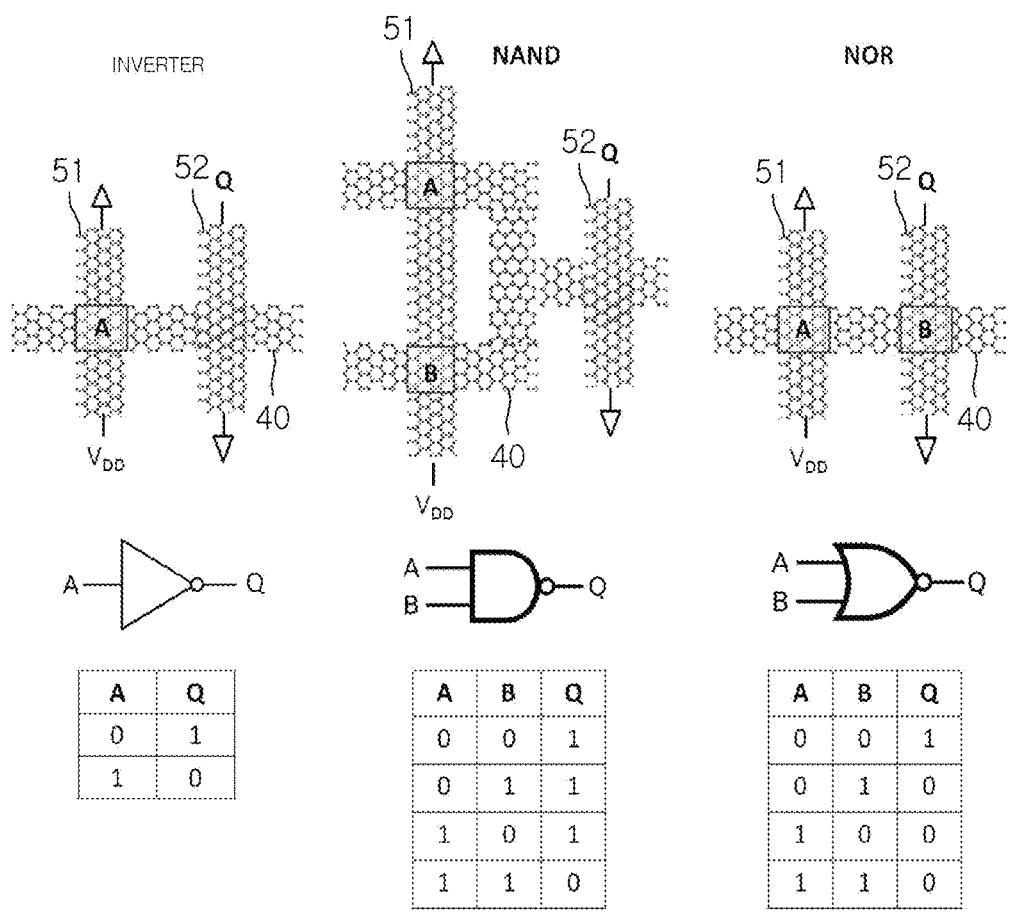

In addition, FIG. 18 illustrates input/output signal tables of an inverter, a NAND gate NAND, and a NOR gate NOR implemented using a graphene spin transistor 100 according to an embodiment of the present disclosure.

However, the present disclosure is not limited thereto, and, it is possible to implement various logic elements (including AND, OR, XOR, XNOR, etc.) using the graphene spin transistor 100 according to an embodiment of the present disclosure and logic elements having modified structures thereof, in addition to the logic elements illustrated in FIGS. 15 to 18.

Therefore, according to the logic elements using a graphene spin transistor 100 according to an embodiment of the present disclosure, it is also possible to implement logic elements exhibiting high integration (e.g., $10^{10}$ gate/cm$^2$ or more) and low power (e.g., 0.1 kW/cm$^2$) beyond the limitation on integration (about $10^9$ gate/cm$^2$) and power consumption (about 10 kW/cm$^2$) of the CMOS devices according to the prior art.

Accordingly, as described above, the graphene spin transistor 100 according to an embodiment of the present disclosure and the graphene Rashba spin logic gate using the same can perform all-electrical operation at room temperature without a magnetic field and a ferromagnetic material, can perform complementary operation with low power consumption, thereby replacing existing CMOS transistors, and can realize high integration, thereby extending Moore's Law by providing a Rashba spin FET using the Rashba-Edelstein effect on the graphene and a spin Hall FET using the spin Hall effect of a TMDC (Transition Metal Dichalcogenide) material and by further implementing a logic element using the Rashba spin FET.

In addition, the present disclosure is expected to have a major knock-on effect on science, technology, industry, the economy, and society. The present disclosure is expected to have a strong influence on industry and the economy in the future. That is, the present disclosure provides a spin FET for all-electrical operation at room temperature for the first time, and is able to be commercialized, unlike the low-temperature spin FETs capable of operating only at low temperature at a liquid helium level, which have been previously developed twice. In addition, it is expected that power consumption will be reduced by at least 100 times or more (e.g., 0.1 kW/cm$^2$), compared to the power consumption of the CMOS technology (e.g., 10 kW/cm$^2$).

Although the present disclosure has been described above on the basis of limitative embodiments and drawings and in conjunction with specific matters such as particular elements, these have been presented merely to help the comprehensive understanding of the present disclosure. The present disclosure is not limited by these embodiments, and those skilled in the art may make various modifications and changes thereto without departing from the essential features of the present disclosure. Therefore, the spirit of the present disclosure should not be defined only by the described embodiments (prior research, etc.), and the scope of the present disclosure should be construed to include all technical ideas defined by the appended claims and equivalents thereof.

What is claimed is:

1. A graphene spin transistor comprising:
   a gate electrode formed in a pattern made of metal;
   a gate insulating film configured to insulate the gate electrode;
   a graphene layer formed to face the gate electrode based on the gate insulating film; and
   a first TMDC pattern and a second TMDC pattern formed to cross the graphene layer in a transverse direction thereof so as to be spaced a predetermined distance apart from each other in a longitudinal direction thereof,
   wherein a spin current is induced due to spin-biased electrons between the first TMDC pattern and the second TMDC pattern using a spin-momentum locking band structure formed at each interface between the graphene layer and the first TMDC pattern, and between the graphene layer and the second TMDC pattern,
   wherein a spin direction of the spin-biased electrons is controlled by a voltage applied to the gate electrode, thereby performing operation,
   wherein a voltage difference between a first area of the second TMDC pattern and a second area of the graphene layer, which is adjacent to the second TMDC pattern in the opposite direction of the first TMDC pattern, has characteristics of an off state when the voltage applied to the gate electrode is zero, and has characteristics of an on state when the applied voltage is greater than or less than a voltage for the off state by a predetermined value, thereby performing operation, and
   wherein output voltage of the graphene spin transistor is produced by the Rashba-Edelstein effect in which an electric field is generated by tilting of the band structure of materials on the junction surfaces between the graphene layer and the first TMDC pattern and the second TMDC pattern, in which up-spin electrons and down-spin electrons are generated due to spin-momentum locking in a Rashba type, and in which injection or diffusion of excessive spin electrons generated on the junction surface between the graphene layer and the first TMDC pattern occurs from the first TMDC pattern to the second TMDC pattern through the graphene layer.

2. The graphene spin transistor of claim 1, wherein a spin electron is generated at a junction surface between the graphene layer and the first TMDC pattern by a current applied to the first TMDC pattern and the voltage applied to the gate electrode according to the Rashba-Edelstein effect, and a spin direction thereof is controlled by the gate voltage, thereby performing operation.

3. The graphene spin transistor of claim 2, wherein the graphene spin transistor controls on/off operations by adjusting the position of the Fermi level of the band structure depending on the voltage applied to the gate electrode.

4. The graphene spin transistor of claim 2, wherein the gate insulating film comprises a high-k insulating film.

5. The graphene spin transistor of claim 2, wherein the graphene spin transistor operates using only electricity without a magnetic field at room temperature.

6. The graphene spin transistor of claim 2, wherein a thickness of the gate insulating film is 1 to 10 nm.

7. A logic gate using a graphene Rashba spin transistor, the logic gate comprising:
   a gate electrode formed in a pattern made of metal;
   a gate insulating film configured to insulate the gate electrode;
   a graphene layer formed to face the gate electrode based on the gate insulating film; and
   a first TMDC pattern and a second TMDC pattern formed to cross the graphene layer in a transverse direction thereof so as to be spaced a predetermined distance apart from each other in a longitudinal direction thereof,
   wherein a spin current is induced due to spin-biased electrons between the first TMDC pattern and the second TMDC pattern using a spin-momentum locking band structure formed at each interface between the graphene layer and the first TMDC pattern, and between the graphene layer and the second TMDC pattern,
   wherein a spin direction of the spin-biased electrons is controlled by a voltage applied to the gate electrode, thereby performing operation,
   wherein a voltage difference between a first area of the second TMDC pattern and a second area of the graphene layer, which is adjacent to the second TMDC pattern in the opposite direction of the first TMDC pattern, has characteristics of an off state when the voltage applied to the gate electrode is zero, and has characteristics of an on state when the applied voltage is greater than or less than a voltage for the off state by a predetermined value, thereby performing operation, and wherein output voltage of the graphene spin transistor is produced by the Rashba-Edelstein effect in which an electric field is generated by tilting of the band structure of materials on the junction surfaces between the graphene layer and the first TMDC pattern and the second TMDC pattern, in which up-spin electrons and down-spin electrons are generated due to spin-momentum locking in a Rashba type, and in which injection or diffusion of excessive spin electrons generated on the junction surface between the graphene layer and the first TMDC pattern occurs from the first TMDC pattern to the second TMDC pattern through the graphene layer.

8. The logic gate of claim 7, wherein a spin electron is generated at a junction surface between the graphene layer and the first TMDC pattern by a current applied to the first TMDC pattern and the voltage applied to the gate electrode according to the Rashba-Edelstein effect, and a spin direction thereof is controlled by the gate voltage, thereby performing operation.

9. The logic gate of claim 7, wherein the graphene layer has a structure in which one side thereof is divided into two or more branches.

10. The logic gate of claim 9, wherein two or more gate electrodes are formed in two or more areas where two or more branches of the graphene layer intersect the first TMDC pattern.

* * * * *